United States Patent
Bower

(10) Patent No.: US 7,061,006 B1
(45) Date of Patent: Jun. 13, 2006

(54) LIGHT EMISSION FROM SEMICONDUCTOR INTEGRATED CIRCUITS

(76) Inventor: Robert W. Bower, 861 Southwood Blvd., #20, Incline Village, NV (US) 89451

( * ) Notice: Subject to any disclaimer, the term of this patent is extended or adjusted under 35 U.S.C. 154(b) by 0 days.

(21) Appl. No.: 10/033,715

(22) Filed: Dec. 28, 2001

Related U.S. Application Data

(60) Provisional application No. 60/259,060, filed on Dec. 28, 2000.

(51) Int. Cl.
*H01L 29/06* (2006.01)
*H01L 29/12* (2006.01)
*H01L 27/15* (2006.01)
*H01L 31/12* (2006.01)
*H01L 21/00* (2006.01)
*H01J 1/62* (2006.01)

(52) U.S. Cl. .............. 257/10; 257/79; 438/20; 313/498; 313/499; 313/506

(58) Field of Classification Search ............ 257/79, 257/80, 81, 10; 313/498, 499, 506, 5; 438/22, 438/20
See application file for complete search history.

(56) References Cited

U.S. PATENT DOCUMENTS

| | | | |
|---|---|---|---|
| 5,391,259 A * | 2/1995 | Cathey et al. ............ | 438/20 |
| 5,717,707 A * | 2/1998 | Beernink et al. .......... | 372/46 |
| 5,949,182 A * | 9/1999 | Shealy et al. ............. | 313/345 |
| 6,346,458 B1 * | 2/2002 | Bower ...................... | 438/458 |
| 6,400,070 B1 * | 6/2002 | Yamada et al. ........... | 313/310 |
| 6,414,444 B1 * | 7/2002 | Fox et al. ................. | 315/169.3 |

OTHER PUBLICATIONS

Ellis, R. K. et al. "Electron Tunneling in Non-planar Floating Gate Memory Structure", IDEM, 1982, pp. 749-752.
Shealy, J.R. et al. "Direct band gap structures on nanometer-scale, micromachined silicon tips", Appl. Phys. Lett. vol. 70, No. 25, Jun. 1997, pp. 3458-3460.
Prickett, B.L. et al. "Trapping in Tunnel Oxides Grown on Textured Polysilicon", 21st annual Proceedings on Reliability Physics, 1983, pp. 114-117.
Dimitrijev, S. "Understanding Semiconductor Devices", Oxford Press, New York, ISBN 019513186X, 2000, Chapter 8, Photonic Devices, Fig. 8.10.
Neamen, D. "Semiconductor Physics & Devices—Basic Principles", second edition, ISBN 0256242143, 1997, p. 67.

(Continued)

*Primary Examiner*—Steven Lake
*Assistant Examiner*—Samuel A Gebremariam
(74) *Attorney, Agent, or Firm*—John P. O'Banion

(57) ABSTRACT

Structures and methods to inject electrons into an insulator from a semiconductor layer that are then collected in a thin layer of a direct semiconductor material which in turn emits light by bandgap recombination.

22 Claims, 1 Drawing Sheet

OTHER PUBLICATIONS

Mayer, J.W. "Electronic Materials Science: For Integrated Circuits in Si and GaAs", Macmillan Publishing, ISBN 0-02-378140-8, 1989, Section 14.8, pp. 431-436.

Grove, A.S. "Physics and Technology of Semiconductor Devices", John Wiley and Sons, ISBN 0471329983, 1967, pp. 128-129.

Sze, S.M. "Physics of Semiconductor Devices", Wiley-Interscience, ISBN 0471056618, 1981, pp. 46, 47, 690, 691.

Wegener, H.A.R. et al. "The prediction of textured poly floating gate memory endurance", 23rd annual Proceedings on Reliability Physics, 1985, pp. 11-17.

* cited by examiner

LIGHT EMISSION FROM SEMICONDUCTOR INTEGRATED CIRCUITS

CROSS-REFERENCE TO RELATED APPLICATIONS

This application claims priority from U.S. provisional application Ser. No. 60/259,060 filed on Dec. 28, 2000, incorporated herein by reference.

STATEMENT REGARDING FEDERALLY SPONSORED RESEARCH OR DEVELOPMENT

Not Applicable

REFERENCE TO A COMPUTER PROGRAM APPENDIX

Not Applicable

BACKGROUND OF THE INVENTION

1. Field of the Invention

This invention pertains generally to light emitting devices, and more particularly to structures and methods to inject electrons from a semiconductor surface, through an insulator layer, and into a layer of optoelectronic material placed on the insulator layer.

2. Description of the Background Art

The following publications, some of which are referred to herein using their corresponding number inside a square bracket (e.g., [1]), are incorporated herein by reference herein as background information for this application:

1. Shealy, J. R.; Macdonald, N. C.; Whittingham, Y. Xu. K. L.; Emerson, D. T.; Pifts, B. L.; "Direct band gap structures on nanometer-scale, micromachined silicon tips", Appl. Physics Letters, Vol. 70, (no. 25), AIP, June 1997, p. 3458–3460.
2. Ellis, R. K., Wegener, H. A. R., and Caywood, J. M., "Electron tunneling in non-planar floating gate memory structure", IDEM, 1982, pp. 749–752.
3. Prickett, B. L., Caywood, J. M., Ellis, R. K., "Trapping in tunnel oxides grown on textured polysilicon", $21^{st}$ annual Proceedings on Reliability Physics, 1983, pp. 114–117.
4. Wegener, H. A. R., Guterman, D. C., "The prediction of textured poly floating gate memory endurance", $23^{rd}$ annual Proceedings on Reliability Physics, 1985, pp. 11–17.

While silicon has been a wonderful material for integrated electronic as well as micromechanical structures, silicon is not a material suitable for light emission. Light emission to and from integrated structures is increasingly important as device integration becomes denser and more complex. Typically, light emitting structures are formed in single crystal direct semiconductors that are found in the compound III-V and II-VI materials and not in the indirect element semiconductors such as silicon and germanium.

Single crystal direct semiconductor integrated circuits have proven to be more difficult and expensive to form into integrated structures, so silicon integrated circuits are the technology of choice. Attempts to integrate light emission with the silicon technology have not met with a great deal of success. While silicon emission has been reported in porous silicon and it is suggested that quantum dots of silicon may be able to emit light, neither of these possibilities appears to be a practical solution at this time. It has also been reported that selectively deposited polycrystalline direct compound semiconductors placed on silicon tip arrays formed in single crystal silicon result in light emission [1]. The light emission is caused by the emission of electrons from the from the high electric field areas of the tips into the deposited direct materials which subsequently emit the light by direct recombination. This technique, however, requires difficult and expensive tips to be formed and does not combine well with the silicon integrated circuit technology.

BRIEF SUMMARY OF THE INVENTION

The present invention comprises a structure and method of generating light emission in an integrated circuit by injecting electrons from a semiconductor or metal surface through an insulating layer that are collected in a direct bandgap film that converts the collected electrons into bandgap radiation. In general terms, the present invention utilizes oxidized polysilicon layers in a silicon integrated circuit to form light emitting structures.

By way of example, and not of limitation, in a preferred embodiment GaInP is deposited on an oxidized polysilicon layer. Note that is not required that the layer of GaINP layer be single crystal. A potential of several volts is then applied between the polysilicon layer and the GaInP to ensure that electrons are emitted from the polysilicon and arrive and are injected into the GaInP with enough energy to allow bandgap radiation to be emitted from the GaInP layer.

In accordance with another aspect of the invention, light emission is accomplished by injecting electrons from a semiconductor or metal surface through an insulating layer that are collected in a direct bandgap film that converts the collected electrons into bandgap radiation. In accordance with a still further aspect of the invention, a light emitting integrated circuit is provided that comprises a semiconductor or metal surface, a direct bandgap film, and an intermediate insulating layer, wherein electrons injected from the semiconductor or metal surface through the insulating layer are collected in the direct bandgap film and converted into bandgap radiation.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Figure 1:
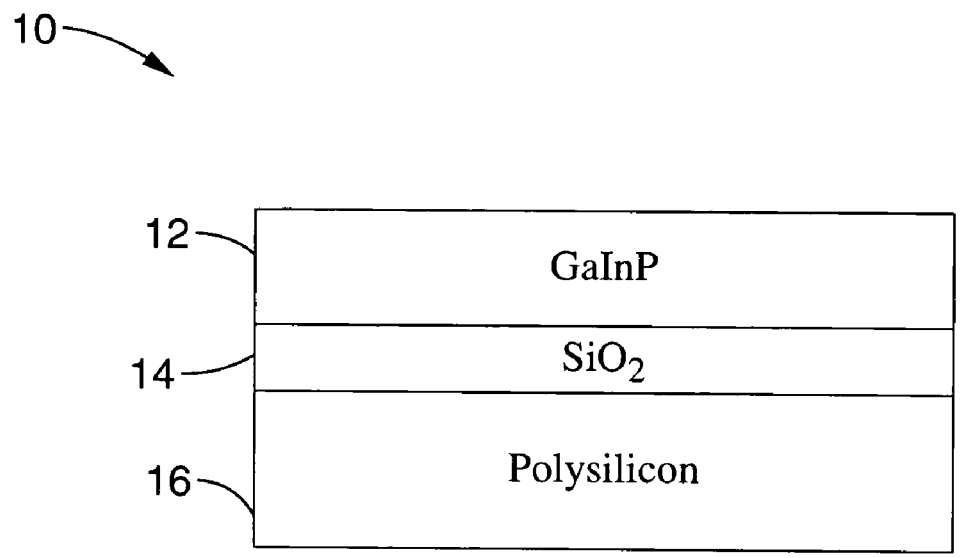
FIG. 1 is schematic diagram in cross-section of a light emitting device according to the present invention.

Referring to FIG. 1, in a preferred embodiment of a light emitting device or integrated circuit 10 according to the present invention, a light emitting layer or film 12 comprising a direct bandgap semiconductor material such as GaInP is deposited on an insulating oxide layer or film 14, such as $SiO_2$, which covers an electron emitting layer or film 16 such as polysilicon.

The GaInP may be deposited by evaporation, sputter deposition, or organometallic vapor phase epitaxy, for example, as is known in the art. The GaInP will not then be single crystal when deposited on the $SiO_2$ surface, but such material is suitable to convert electrons emitted from the polysilicon and injected into the GaInP into direct bandgap radiation [1]. The radiation from the GaInP creates light emission from the silicon that may be used for optical communication within the integrated circuit chip or off the chip, between chips in a three dimensional configuration (such as described in my copending U.S. application Ser. No. 09/476,456 filed on Dec. 30, 1999, incorporated herein by reference, or Ser. No. 09/451,514 filed on Nov. 30, 1999, incorporated herein by reference), or in other configurations.

The $SiO_2$ layer is preferably on the order of tens of nanometers in thickness. Furthermore, the oxidized polysilicon layer is preferably formed in a manner that promotes the formation of asperities on the surface of the polysilicon that promote field emission of electrons into the $SiO_2$ layer overlying the polysilicon layer.

Properties of oxidized polysilicon formed in a manner that promotes asperities and characteristics of field emission of electrons are well known in the art [2–4]. Methods of oxidizing polysilicon are also well known in the art. It is further well known in the art that steam oxidation of polysilicon leads to enhanced asperities. Furthermore, partial removal of a steam oxide grown on polysilicon followed by reoxidation in steam are also known to enhance asperity formation. Such methods are well known in the semiconductor industry and have been used in non-volatile memory technologies.

To cause light emission to take place, a potential of approximately five to approximately twenty volts is applied between the GaInP layer 12 and the polysilicon layer 16. The voltage chosen varies based on the oxidation condition of the polysilicon, the thickness of the final $SiO_2$ layer over the polysilicon, and the bandgap of the GaInP material. The potential applied is positive with on the GaInP with respect to the polysilicon so as to attract electrons from the polysilicon into the GaInP layer. This enhances electron emission from the polysilicon and ensures that electrons are emitted from the polysilicon and arrive and are injected into the GaInP with sufficient energy to create bandgap light to be emitted from the GaInP layer. Electrons are thus injected through the $SiO_2$ and into the GaInP layer from the sharp asperities on the surface of the polysilicon with enough energy to allow bandgap radiation to be emitted from the GaInP layer.

It will be appreciated that the structure and method of the invention is not limited to the preferred embodiment thus described. The light emitting material 12 may be any of the materials that may be stimulated by suitable electrons to produce bandgap light. The barrier 14 separating the electron emitting material may be any insulator or junction barrier structure. The electron emitting material 16 may be any electron emitting material that includes a variety of single and polysilicon crystal semiconductors and metals. For example, the light emitting material 12 can be a direct semiconductor, such as GaAs, InP, GaInP, and GaInN, and can be a single crystal, polycrystalline or amorphous material. The insulator 14 can be any barrier, an insulator, $SiO_2$, or other common insulators. The electron emitting material 16 can be a metal, semiconductor, silicon, single crystal, or polysilicon material.

Figure 2:
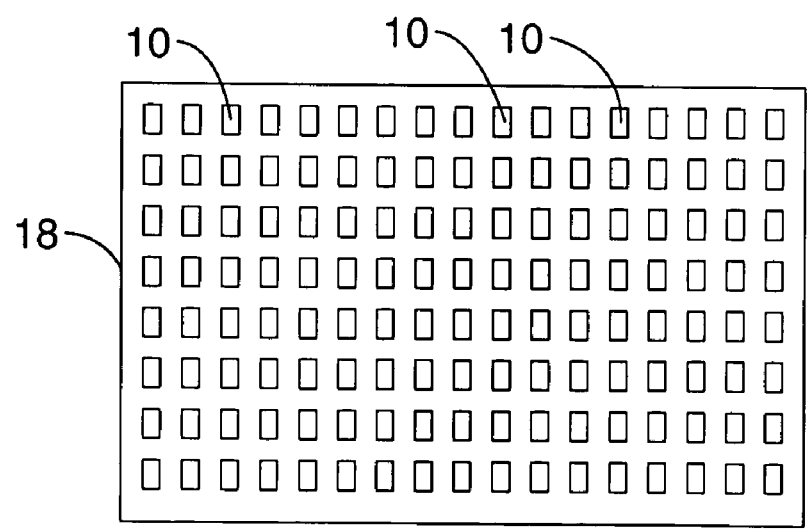
FIG. 2 is a schematic plan view of a light emitting panel according to the invention using a plurality of light emitting devices of FIG. 1 arranged in a mosaic array.

Referring now to FIG. 2, it will be appreciated that the present invention can be used for forming one-dimensional or two-dimensional light emitting panels. In FIG. 2, a plurality of optoelectronic structures 10 are arranged in a mosaic array to form a light emitting panel 18. In one configuration, elements of the array of optoelectronic structures would generally be connected to provide a common potential to the entire array, while the individual polysilicon elements could be individually addressed with a potential applied to cause or modulate electron emission and thus light. In another configuration, individual optoelectronic elements or a group thereof could be individually addressed so as to cause or modulate emissions. In yet another configuration, combinations of optoelectronic elements, as well as sets of polysilicon emitters, could be addressed to provide potentials to cause or modulate light emissions.

Although the description above contains many specificities, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A multilayer light emitting device, comprising:
   a polysilicon electron emitting layer;
   an amorphous insulating layer over the electron emitting layer; and
   a direct bandgap light emitting layer over the insulating layer;
   wherein electrons emitted from the electron emitting layer pass through the insulating layer and into the light emitting layer and are converted into bandgap radiation by the light emitting layer; and
   wherein said electron emitting layer is formed with asperities that promote field emission of electrons into the insulating layer.

2. A light emitting device as recited in claim 1, wherein said insulating layer comprises $SiO_2$.

3. A light emitting device as recited in claim 1, wherein said light emitting layer comprises GaInP.

4. A light emitting device as recited in claim 1, wherein said insulating layer and said electron emitting layer comprise in combination an oxidized polysilicon layer.

5. A multilayer light emitting device, comprising:
   a polysilicon layer;
   an oxide layer over said polysilicon layer; and
   a direct bandgap light emitting layer over said oxide layer;
   wherein electrons emitted from the polysilicon layer are converted into bandgap radiation by the light emitting layer; and wherein said polysilicon layer is formed with asperities that promote field emission of electrons into the oxide layer.

6. A light emitting device as recited in claim 5, wherein said light emitting layer comprises GaInP.

7. A multilayer light emitting device, comprising: a polysilicon layer; an oxide layer over said polysilicon layer; and a GaInP layer over said oxide layer; wherein said polysilicon layer is formed with asperities that promote field emission of electrons into the oxide layer.

8. A light emitting device as recited in claim 7, wherein electrons emitted from the polysilicon layer are converted into bandgap radiation by the GaInP layer.

9. A multilayer light emitting device, comprising: a polysilicon layer; an oxide layer over said polysilicon layer; and a direct bandgap semiconductor layer over said oxide layer; wherein said polysilicon layer is formed with asperities that promote field emission of electrons into the oxide layer.

10. A light emitting device as recited in claim 9, wherein electrons emitted from the polysilicon layer are converted into bandgap radiation by the direct bandgap layer.

11. A light emitting device as recited in claim 10, wherein said direct bandgap layer comprises GaInP.

12. A light emitting panel comprising a plurality of devices as recited in claim 1, 5, 7, or 9 arranged in a mosaic array.

13. A method for generating light emission in a multilayer light emitting device, comprising:
    injecting electrons from a polysilicon electron emitting layer through an insulating layer and into a direct bandgap light emitting layer where said electrons are converted into to bandgap radiation;
    wherein said electron emitting layer comprises a material formed with asperities that promote field emission of electrons into said insulating layer.

14. A method as recited in claim 13, wherein said insulating layer comprises $SiO_2$.

15. A method as recited in claim 13, wherein said light emitting layer comprises GaInP.

16. A method as recited in claim 13, wherein said insulating layer and said electron emitting layer comprise in combination an oxidized polysilicon layer.

17. A method for generating light emission in a multilayer light emitting device, comprising:
    injecting electrons from a polysilicon layer through an oxide layer and into a direct bandgap light emitting layer where said electrons are converted into bandgap radiation;
    wherein said polysilicon layer is formed with asperities that promote field emission of electrons into the oxide layer.

18. A method as recited in claim 17, wherein said light emitting layer comprises GaInP.

19. A method for generating light emission in a multilayer light emitting device, comprising: injecting electrons from a polysilicon layer through an oxide layer and into a GaInP layer where said electrons are converted into bandgap radiation; wherein said polysilicon layer is formed with asperities that promote field emission of electrons into the oxide layer.

20. A method for generating light emission in a multilayer light emitting device, comprising: injecting electrons from a polysilicon layer through an oxide layer and into a direct bandgap semiconductor layer where said electrons are converted into bandgap radiation; wherein said polysilicon layer is formed with asperities that promote field emission of electrons into said oxide layer.

21. A method as recited in claim 20, wherein said direct bandgap layer comprises GaInP.

22. A method for generating light emission in a multilayer light emitting device, comprising: injecting electrons from a polysilicon electron emitting layer through an oxide layer and into a GaInP layer where said electrons are converted into bandgap radiation; wherein said polysilicon layer is formed with asperities that promote field emission of electrons into said oxide layer.

* * * * *